US010508190B2

(12) United States Patent
Kim et al.

(10) Patent No.: US 10,508,190 B2
(45) Date of Patent: Dec. 17, 2019

(54) POLYESTER RESIN COMPOSITION AND MOLDED ARTICLE MANUFACTURED THEREFROM

(71) Applicant: Lotte Advanced Materials Co., Ltd., Yeosu-si (KR)

(72) Inventors: Yang Il Kim, Uiwang-si (KR); Tae Gon Kang, Uiwang-si (KR); Chan Moo Park, Uiwang-si (KR); In Geol Baek, Uiwang-si (KR); Sang Hyun Hong, Uiwang-si (KR)

(73) Assignee: Lotte Advanced Materials Co., Ltd., Yeosu-si (KR)

( * ) Notice: Subject to any disclaimer, the term of this patent is extended or adjusted under 35 U.S.C. 154(b) by 0 days.

(21) Appl. No.: 14/971,348

(22) Filed: Dec. 16, 2015

(65) Prior Publication Data

US 2016/0177052 A1    Jun. 23, 2016

(30) Foreign Application Priority Data

Dec. 17, 2014    (KR) ........................ 10-2014-0182421

(51) Int. Cl.
*C08K 3/34* (2006.01)
*C08K 3/22* (2006.01)
*H01L 33/60* (2010.01)
*C08K 7/14* (2006.01)

(52) U.S. Cl.
CPC ................. *C08K 3/34* (2013.01); *C08K 3/22* (2013.01); *C08K 7/14* (2013.01); *H01L 33/60* (2013.01); *C08K 2003/2241* (2013.01)

(58) Field of Classification Search
CPC .... C08K 3/34; C08K 3/22; C08K 2003/2241; C08K 7/14; H01L 33/60; C08L 67/02
USPC .................................. 524/456, 436
See application file for complete search history.

(56) References Cited

U.S. PATENT DOCUMENTS

| | | |
|---|---|---|
| 4,006,272 A | 2/1977 | Sakaguchi et al. |
| 4,027,073 A | 5/1977 | Clark |
| 4,034,013 A | 7/1977 | Lane |
| 4,045,514 A | 8/1977 | Iwahashi et al. |
| 4,139,600 A | 2/1979 | Rollmann et al. |
| 4,177,185 A | 12/1979 | Tacke et al. |
| 4,180,494 A | 12/1979 | Fromuth et al. |
| 4,185,044 A | 1/1980 | Tacke et al. |
| 4,287,315 A | 9/1981 | Meyer et al. |
| 4,303,772 A | 12/1981 | Novicky |
| 4,393,153 A | 7/1983 | Hepp |
| 4,400,333 A | 8/1983 | Neefe |
| 4,639,480 A | 1/1987 | Birum |
| 4,664,983 A | 5/1987 | Nakamura et al. |
| 4,694,031 A | 9/1987 | Morita et al. |
| 4,745,029 A | 5/1988 | Kambour |
| 4,753,980 A | 6/1988 | Deyrup |
| 4,788,251 A | 11/1988 | Brown et al. |
| 4,803,235 A | 2/1989 | Okada |
| 4,900,610 A | 2/1990 | Hochberg et al. |
| 4,906,202 A | 3/1990 | Germ |
| 4,906,696 A | 3/1990 | Fischer et al. |
| 4,990,549 A | 2/1991 | Delvin et al. |
| 5,025,066 A | 6/1991 | DeRudder et al. |
| 5,061,558 A | 10/1991 | Fischer et al. |
| 5,068,285 A | 11/1991 | Laughner |
| 5,124,402 A | 6/1992 | Laughner et al. |
| 5,189,091 A | 2/1993 | Laughner |
| 5,200,492 A | 4/1993 | Ohnaga et al. |
| 5,219,915 A | 6/1993 | McKee et al. |
| 5,242,967 A | 9/1993 | Minnick |
| 5,256,718 A | 10/1993 | Yamamoto et al. |
| 5,280,070 A | 1/1994 | Drzewinski et al. |
| 5,284,916 A | 2/1994 | Drzewinski |
| 5,292,809 A | 3/1994 | Drzewinski et al. |
| 5,308,894 A | 5/1994 | Laughner |
| 5,369,154 A | 11/1994 | Laughner |
| 5,382,628 A | 1/1995 | Stewart et al. |
| 5,441,997 A | 8/1995 | Walsh et al. |
| 5,449,557 A | 9/1995 | Liebler et al. |
| 5,470,658 A | 11/1995 | Gasca et al. |
| 5,529,716 A | 6/1996 | Nomura et al. |
| 5,841,088 A | 11/1998 | Yamaguchi et al. |
| 5,849,380 A | 12/1998 | Kashiba et al. |
| 5,863,974 A | 1/1999 | Tjahjadi et al. |
| 6,060,538 A | 5/2000 | Gallucci |
| 6,238,732 B1 | 5/2001 | Cameron et al. |
| 6,252,002 B1 | 6/2001 | Yamada et al. |
| 6,277,905 B1 | 8/2001 | Keep |
| 6,310,129 B1 | 10/2001 | Lilly et al. |
| 6,486,251 B1 | 11/2002 | Patel |
| 6,506,830 B1 | 1/2003 | Bussi et al. |
| 6,545,089 B1 | 4/2003 | DeRudder et al. |
| 6,646,068 B2 | 11/2003 | Chisholm et al. |
| 6,653,391 B1 | 11/2003 | Weber et al. |
| 7,009,029 B2 | 3/2006 | Oka et al. |
| 7,294,659 B2 | 11/2007 | Yatake |
| 7,385,013 B2 | 6/2008 | Kobayashi et al. |
| 7,671,143 B2 | 3/2010 | Lee et al. |
| 7,732,515 B2 | 6/2010 | Jang et al. |
| 7,960,464 B2 | 6/2011 | Kobayashi et al. |
| 8,044,134 B2 | 10/2011 | Chung et al. |
| 8,044,143 B2 | 10/2011 | Park et al. |

(Continued)

FOREIGN PATENT DOCUMENTS

| | | |
|---|---|---|
| CN | 1285858 A | 2/2001 |
| CN | 1376182 A | 10/2002 |

(Continued)

OTHER PUBLICATIONS

Wypych, G., "2.1.67 Wollastonite," Handbook of Fillers, 3d Ed., pp. 151-152, Toronto, Ontario: ChemTec Publishing (2010).*

(Continued)

*Primary Examiner* — Josephine L Chang
(74) *Attorney, Agent, or Firm* — Additon, Higgins & Pendleton, P.A.

(57) ABSTRACT

Disclosed herein is a polyester resin composition and a molded article manufactured therefrom. The polyester resin composition includes: (A) a polyester resin; (B) a white pigment; and (C) a reflectance retention agent comprising an inorganic compound having a pH of about 7.5 to about 14.

15 Claims, No Drawings

(56) References Cited

U.S. PATENT DOCUMENTS

| | | |
|---|---|---|
| 8,178,608 B2 | 5/2012 | Nakamura et al. |
| 8,304,481 B2 | 11/2012 | Nakamura et al. |
| 8,426,549 B2 | 4/2013 | Ogasawara |
| 8,815,993 B2 | 8/2014 | Kim et al. |
| 8,933,158 B2 | 1/2015 | Shiobara et al. |
| 9,018,296 B2 | 4/2015 | Lee et al. |
| 9,062,198 B2 | 6/2015 | Lu |
| 9,187,621 B2 | 11/2015 | Lu |
| 9,437,790 B2 | 9/2016 | Kim et al. |
| 2002/0042483 A1 | 4/2002 | Vanderbilt |
| 2002/0111409 A1 | 8/2002 | Talibuddin |
| 2003/0032725 A1 | 2/2003 | Gaggar et al. |
| 2004/0102604 A1 | 5/2004 | Bassler et al. |
| 2004/0175466 A1 | 9/2004 | Douglas et al. |
| 2005/0113532 A1 | 5/2005 | Fish, Jr. et al. |
| 2005/0159533 A1 | 7/2005 | Nabeshima et al. |
| 2005/0165207 A1 | 7/2005 | Agarwal et al. |
| 2005/0239949 A1 | 10/2005 | Nakamura et al. |
| 2006/0004154 A1 | 1/2006 | DeRudder et al. |
| 2006/0030647 A1 | 2/2006 | Ebeling et al. |
| 2006/0051587 A1 | 3/2006 | Mori et al. |
| 2006/0100307 A1 | 5/2006 | Uerz et al. |
| 2006/0135690 A1 | 6/2006 | Juikar et al. |
| 2007/0155913 A1 | 7/2007 | Chakravarti et al. |
| 2007/0161741 A1 | 7/2007 | Ogasawara |
| 2007/0213458 A1 | 9/2007 | Topoulos |
| 2007/0265371 A1 | 11/2007 | Takahashi et al. |
| 2007/0282056 A1 | 12/2007 | Schellekens et al. |
| 2008/0009571 A1 | 1/2008 | Pixton et al. |
| 2008/0146718 A1 | 6/2008 | Gijsman et al. |
| 2008/0153954 A1 | 6/2008 | Arpin |
| 2008/0242789 A1 | 10/2008 | Zhu et al. |
| 2009/0069479 A1 | 3/2009 | Seki |
| 2009/0080079 A1 | 3/2009 | Kogure et al. |
| 2009/0118402 A1 | 5/2009 | Jang et al. |
| 2009/0143267 A1 | 6/2009 | Zhang et al. |
| 2009/0209696 A1 | 8/2009 | Lee et al. |
| 2009/0215934 A1 | 8/2009 | Nakamura et al. |
| 2009/0253847 A1 | 10/2009 | Komatsu et al. |
| 2009/0275678 A1 | 11/2009 | Kumazawa et al. |
| 2010/0029855 A1 | 2/2010 | Matsuoka et al. |
| 2010/0113648 A1 | 5/2010 | Niessner et al. |
| 2010/0113656 A1 | 5/2010 | Saga |
| 2010/0152357 A1 | 6/2010 | Kwon et al. |
| 2010/0160529 A1 | 6/2010 | Lee et al. |
| 2010/0160532 A1 | 6/2010 | Park et al. |
| 2010/0168272 A1 | 7/2010 | Park et al. |
| 2010/0197827 A1 | 8/2010 | Kim et al. |
| 2010/0227957 A1 | 9/2010 | Fujii |
| 2010/0240831 A1 | 9/2010 | Kim et al. |
| 2010/0256288 A1 | 10/2010 | Kim et al. |
| 2011/0009524 A1 | 1/2011 | Kwon et al. |
| 2011/0021677 A1 | 1/2011 | Kwon et al. |
| 2011/0040019 A1 | 2/2011 | Kwon et al. |
| 2011/0160380 A1 | 6/2011 | Kwon et al. |
| 2011/0310622 A1 | 12/2011 | Topoulos |
| 2012/0065318 A1 | 3/2012 | Park et al. |
| 2012/0129989 A1 | 5/2012 | Kim et al. |
| 2012/0165448 A1 | 6/2012 | Lee et al. |
| 2012/0264868 A1 | 10/2012 | Lu |
| 2012/0264871 A1 | 10/2012 | Moon et al. |
| 2012/0305287 A1 | 12/2012 | Ni |
| 2012/0329938 A1* | 12/2012 | Kim .................... C08K 3/0033 524/494 |
| 2013/0005875 A1 | 1/2013 | Shoji et al. |
| 2013/0158184 A1 | 6/2013 | Topoulos |
| 2013/0172453 A1 | 7/2013 | Lee et al. |
| 2013/0217830 A1 | 8/2013 | Crawford et al. |
| 2013/0281587 A1 | 10/2013 | Shim et al. |
| 2014/0167088 A1 | 6/2014 | Lu |
| 2014/0167091 A1 | 6/2014 | Ogasawara et al. |
| 2014/0187662 A1* | 7/2014 | Lee .................... C08L 77/06 522/63 |
| 2014/0187700 A1* | 7/2014 | Lee .................... C08L 67/02 524/396 |
| 2014/0309356 A1 | 10/2014 | Kim et al. |
| 2014/0350163 A1 | 11/2014 | Kim et al. |
| 2017/0037240 A1 | 2/2017 | Kim et al. |

FOREIGN PATENT DOCUMENTS

| | | |
|---|---|---|
| CN | 101550282 A | 10/2009 |
| CN | 101560325 A | 10/2009 |
| CN | 101597423 A | 12/2009 |
| CN | 101747602 A | 6/2010 |
| CN | 102725349 A | 10/2012 |
| CN | 102838849 A | 12/2012 |
| CN | 103270114 A | 8/2013 |
| CN | 103910979 A | 7/2014 |
| CN | 103911000 A | 7/2014 |
| DE | 19845317 A1 | 4/2000 |
| DE | 69829099 T2 | 12/2005 |
| DE | 10 2013 226 703 A1 | 7/2014 |
| EP | 0033393 A2 | 8/1981 |
| EP | 0114288 A2 | 8/1984 |
| EP | 0180417 A2 | 5/1986 |
| EP | 0246620 A2 | 5/1987 |
| EP | 0376616 A2 | 7/1990 |
| EP | 0528462 A1 | 2/1993 |
| EP | 0787769 A2 | 8/1997 |
| EP | 1010725 A2 | 6/2000 |
| EP | 1147812 A1 | 10/2001 |
| EP | 2204412 A1 | 7/2010 |
| JP | 53-134799 A | 11/1978 |
| JP | 57-125241 A | 8/1982 |
| JP | 58-196250 A | 11/1983 |
| JP | 62-268612 A | 11/1987 |
| JP | 04-023856 A | 1/1992 |
| JP | 04-359954 A | 12/1992 |
| JP | 05-005055 | 1/1993 |
| JP | 05-098136 A | 4/1993 |
| JP | 05-125260 A | 5/1993 |
| JP | 05-194829 | 8/1993 |
| JP | 06-122771 A | 5/1994 |
| JP | 06-136212 A | 5/1994 |
| JP | 1994-200132 A | 7/1994 |
| JP | 06-313089 A | 11/1994 |
| JP | 07-026101 | 1/1995 |
| JP | 1995-228776 | 8/1995 |
| JP | 10-060241 A | 3/1998 |
| JP | 10-060242 A | 3/1998 |
| JP | 10-219026 A | 8/1998 |
| JP | 11-129246 A | 5/1999 |
| JP | 11-171984 A | 6/1999 |
| JP | 11-181168 A | 7/1999 |
| JP | 11-279385 | 10/1999 |
| JP | 2000-063641 A | 2/2000 |
| JP | 2000-204244 A | 7/2000 |
| JP | 2000-264959 A | 9/2000 |
| JP | 2000-265001 A | 9/2000 |
| JP | 2000-327992 | 11/2000 |
| JP | 2001-049072 A | 2/2001 |
| JP | 2002-001125 A | 1/2002 |
| JP | 2002-080676 A | 3/2002 |
| JP | 2002-201344 A | 7/2002 |
| JP | 2002-294070 A | 10/2002 |
| JP | 2003-525335 | 8/2003 |
| JP | 2003-313392 | 11/2003 |
| JP | 2004-075994 A | 3/2004 |
| JP | 4325753 | 12/2004 |
| JP | 2005-097462 A | 4/2005 |
| JP | 2005-220173 A | 8/2005 |
| JP | 2006-249292 A | 9/2006 |
| JP | 2006-257284 A | 9/2006 |
| JP | 2006-342246 A | 12/2006 |
| JP | 2007-077222 | 3/2007 |
| JP | 2007-084952 A | 4/2007 |
| JP | 2007-218980 | 8/2007 |
| JP | 2008-013702 A | 1/2008 |
| JP | 4915155 | 1/2008 |
| JP | 2008-505233 A | 2/2008 |
| JP | 2009-507990 A1 | 2/2009 |
| JP | 2009-173015 A | 8/2009 |
| JP | 2009-263640 A | 11/2009 |

(56) References Cited

FOREIGN PATENT DOCUMENTS

| | | |
|---|---|---|
| JP | 2011-094026 A | 5/2011 |
| JP | 2013-251510 A | 12/2013 |
| JP | 2014-148615 A | 8/2014 |
| KR | 10-1999-0018287 | 3/1993 |
| KR | 1996-0007611 B1 | 6/1996 |
| KR | 10-1998-0004915 | 6/1998 |
| KR | 10-1998-027070 | 7/1998 |
| KR | 1998-055579 | 9/1998 |
| KR | 10-1999-0029495 A | 4/1999 |
| KR | 10-1999-0054644 | 7/1999 |
| KR | 10-2000-0038719 A | 7/2000 |
| KR | 10-2000-0048033 A | 7/2000 |
| KR | 10-2001-0032100 A | 4/2001 |
| KR | 10-2001-0070975 A | 7/2001 |
| KR | 2004-0079118 A | 9/2004 |
| KR | 10-2005-0032100 A | 4/2005 |
| KR | 10-0514272 B | 9/2005 |
| KR | 10-2005-0109049 A | 11/2005 |
| KR | 10-0581437 B | 5/2006 |
| KR | 10-2006-0135649 A | 12/2006 |
| KR | 10-0709878 B1 | 4/2007 |
| KR | 10-2007-0070686 A | 7/2007 |
| KR | 10-2007-0072372 A | 7/2007 |
| KR | 10-2007-0072375 A | 7/2007 |
| KR | 10-2007-0093994 A | 9/2007 |
| KR | 10-0767428 A1 | 10/2007 |
| KR | 2007-7026437 A | 12/2007 |
| KR | 10-2008-0062975 A | 7/2008 |
| KR | 10-2008-0063054 A | 7/2008 |
| KR | 10-0871436 B1 | 11/2008 |
| KR | 10-2009-0030511 A | 3/2009 |
| KR | 10-0886348 B1 | 3/2009 |
| KR | 10-2010-0071715 | 6/2010 |
| KR | 10-2011-0078044 A | 7/2011 |
| KR | 10-2012-0066740 A | 6/2012 |
| KR | 10-2012-0140332 A | 12/2012 |
| KR | 10-2013-0076027 A | 7/2013 |
| KR | 10-2013-0076733 A | 7/2013 |
| KR | 10-2013-0116813 A | 10/2013 |
| KR | 10-2014-0075517 A | 6/2014 |
| TW | 201306319 A | 2/2013 |
| TW | 201343743 A | 11/2013 |
| TW | 201343777 A | 11/2013 |
| WO | 02/088044 A1 | 11/2002 |
| WO | 2003/085029 A1 | 10/2003 |
| WO | 2005/075554 A1 | 8/2005 |
| WO | 2007/119920 A1 | 10/2007 |
| WO | 2007/140101 A1 | 12/2007 |
| WO | 2008/039017 A1 | 4/2008 |
| WO | 2008/081791 A1 | 7/2008 |
| WO | 2009/078593 A1 | 6/2009 |
| WO | 2009/078602 A1 | 6/2009 |
| WO | 2009/113762 A2 | 9/2009 |
| WO | 2009/116722 A1 | 9/2009 |
| WO | 2009/128601 A1 | 10/2009 |
| WO | 2010/143796 A1 | 12/2010 |
| WO | 2011/013882 A1 | 2/2011 |
| WO | 2012/081801 A1 | 6/2012 |
| WO | 2013/100578 A1 | 7/2013 |
| WO | 2013/101277 A1 | 7/2013 |
| WO | 2013125453 A | 8/2013 |
| WO | 2013/129201 A1 | 9/2013 |
| WO | 2015/102177 A1 | 7/2015 |

OTHER PUBLICATIONS

Devaney, R., "The structure and electrical properties of poly(1,4-cyclohexylenedinnethylene terephthalate), a new linear thermoplastic polyester," National Academy of Sciences—National Research Council, vol. 1080, pp. 32-35. (Year: 1963).*

Turner et al., "Cyclohexanedimethanol Polyesters", 2001, pp. 127-134.
Full Translation of Higuchi et al. JP 2007-218980, pp. 1-32.
International Search Report in commonly owned International Application No. PCT/KR2011/006328 dated Apr. 4, 2012, pp. 1-4.
Taiwanese Office Action in commonly owned Taiwanese Application No. 96136059 dated May 5, 2011, pp. 1-9.
English Translation of Taiwanese Office Action in commonly owned Taiwanese Application No. 96136059 dated May 5, 2011, pp. 1-5.
European Search Report in commonly owned European Application No. 07808474 dated Sep. 28, 2011, pp. 1-4.
International Preliminary Report on Patentability in commonly owned International Application No. PCT/KR2007/004743, dated Mar. 31, 2009, pp. 1-5.
International Search Report in commonly owned International Application No. PCT/KR2007/004743, dated Jan. 4, 2008, pp. 1-2.
French Search Report and Written Opinion in commonly owned French Application No. 0959193 dated May 27, 2010, pp. 1-5.
International Search Report in commonly owned International Application No. PCT/KR2009/007917 dated Aug. 24, 2010, pp. 1-9.
English-translation of Abstract for Korean Publication No. 1998-055579, published Sep. 25, 1998, pp. 1.
IGRANOX 1076, SpecialChem, Ciba, now part of BASF, 2012 Retrieved online<http://www.specialchem4adhesives.com>, pp. 1.
Chinese Search Report in commonly owned Chinese Application No. 200980159831.0 dated Dec. 17, 2012, pp. 1-2.
European Search Report in commonly owned European Application No. 08862371 dated Dec. 7, 2010, pp. 1-6.
International Search Report in commonly owned International Application No. PCT/KR2008/006870, dated May 28, 2009, pp. 1-2.
Chinese Office Action in commonly owned Chinese Application No. 200910211954 dated Jun. 23, 2011, pp. 1-5.
English translation of Chinese Office Action in commonly owned Chinese Application No. 200910211954 dated Jun. 23, 2011, pp. 1-5.
Katrizky et al., "Correlation and Prediction of the Refractive Indices of Polymers by QSPR", Journal of Chemical Information and Computer Sciences, pp. 1171-1176, (1998).
European Search Report in commonly owned European Application No. 09180634 dated Feb. 2, 2010, pp. 1-3.
Xu, "Predicition of Refractive Indices of Linear Polymers by a four-descriptor QSPR model", Polymer, 45 (2004) pp. 8651-8659.
European Search Report in commonly owned European Application No. 10196806 dated Apr. 27, 2011, pp. 1-5.
European Search Report in commonly owned European Application No. 08873425.6 dated May 29, 2012, pp. 1-5.
International Search Report in commonly owned International Application No. PCT/KR2008/007157, dated May 28, 2009, pp. 1-2.
International Search Report in commonly owned International Application No. PCT/KR2008/007825, dated Aug. 28, 2009, pp. 1-2.
International Search Report in commonly owned International Application No. PCT/KR2008/007820 dated Jul. 28, 2009, pp. 1-2.
International Search Report in commonly owned International Application No. PCT/KR2009/007944 dated Aug. 13, 2010, pp. 1-6.
Full English Translation of JP 04-359953, pp. 1-10.
Full English Translation of JP 04-359954, pp. 1-8.
International Search Report in commonly owned International Application No. PCT/KR2012/011485 dated Apr. 16, 2013, pp. 1-4.
Poly(cyclohexanedimethylene terephthalate), pp. 1-2, obtained online from http://www.polymerprocessing.com/polymers/PCT.html. No publication date given.
International Search Report in commonly owned International Application No. PCT/KR2014/005080 dated Sep. 26, 2014, pp. 1-4.
Office Action in commonly owned Japanese Application No. 2014-242031 dated May 1, 2018, pp. 1-5.

* cited by examiner

POLYESTER RESIN COMPOSITION AND MOLDED ARTICLE MANUFACTURED THEREFROM

CROSS-REFERENCE TO RELATED APPLICATION

This application claims the benefit of and priority to Korean Patent Application No. 10-2014-0182421, filed on Dec. 17, 2014 in the Korean Intellectual Property Office, the entire disclosure of which is incorporated herein by reference.

FIELD

The present invention relates to a polyester resin composition and a molded article manufactured therefrom.

BACKGROUND

Polyester resins are used for various applications such as films, fibers, mechanical components, and electronic components due to excellent properties thereof in terms of heat resistance, mechanical strength, transparency, chemical resistance, and the like. For example, polyester resins can be used as materials for reflectors, scramblers, and/or housings of light emitting diodes (LEDs), which have received recent attention as a replacement for many existing light sources.

A reflector for light emitting diodes is a component for improving luminous efficacy of a light emitting diode chip by reflecting light emitted from the light emitting diode chip toward a front side thereof while enveloping and protecting the light emitting diode chip. The reflector can suffer from significant deterioration in reflectance and extraction capability due to discoloration after extended use.

Inorganic particles can be added to the reflector in order to improve reflectance of the reflector by taking reflectance and whiteness into account. However, since the reflector can suffer from change in color upon molding and significant reduction in reflectance over time, it can be difficult to obtain sufficient brightness.

There has also been an attempt to manufacture a reflector using a ceramic material. There is a drawback, however, in that the ceramic material is uneconomical due to deterioration in productivity despite excellent heat resistance and chemical resistance thereof.

Therefore, for extension of lifespan of light emitting diode illumination devices, there is a need for a polyester resin composition which exhibits minimal or no change in reflectance and whiteness even after extended use, thereby securing excellent reflectivity and yellow index.

SUMMARY

Embodiments provide a polyester resin composition which can exhibit improved reflectivity, reflectance retention rate and yellowing resistance while maintaining mechanical properties, and a molded article manufactured from the polyester resin composition.

The polyester resin composition may include: (A) a polyester resin; (B) a white pigment; and (C) a reflectance retention agent including an inorganic compound having a pH of about 7.5 to about 14.

The polyester resin composition may include: about 30 wt % to about 80 wt % of the (A) polyester resin; about 10 wt % to about 60 wt % of the (B) white pigment; and about 1 wt % to about 40 wt % of the (C) reflectance retention agent.

The (A) polyester resin may include a compound including repeat units represented by Formula 1 and can have a melting point of about 200° C. or more:

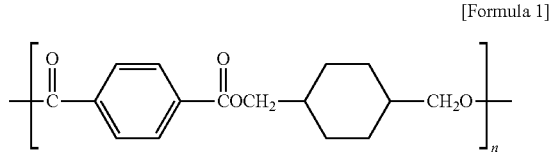

[Formula 1]

wherein n is an integer of 10 to 500.

The (B) white pigment may include titanium oxide, zinc oxide, zinc sulfide, white lead, zinc sulfate, barium sulfate, calcium carbonate, aluminum oxide and the like, and mixtures thereof.

The (B) white pigment may have a particle size of about 0.05 μm to about 2.0 μm.

The (C) reflectance retention agent may have a pH of about 9 to about 11.

The (C) reflectance retention agent may be an inorganic compound including a metal.

The metal may include alkali metals, alkaline earth metals and the like, and mixtures thereof.

The (C) reflectance retention agent may have an acicular shape having a ratio of length to particle diameter of about 5:1 to about 20:1.

The polyester resin composition may further include: an additive comprising at least one selected from UV stabilizers, fluorescent whitening agents, lubricants, release agents, nucleating agents, antistatic agents, stabilizers, reinforcing agents, inorganic additives, pigments, dyes, and the like and mixtures thereof.

A molded article may be manufactured from the polyester resin composition as set forth above.

The molded article may have an initial reflectance of about 92 or more, as measured at a wavelength of 450 nm using a colorimeter, and a reflectance of about 89 or more, as measured at a wavelength of 450 nm using a colorimeter after the molded article is left at 85° C. and 85% relative humidity (RH) for 300 hours.

A ratio of reflectance (R) of the molded article, as measured at a wavelength of 450 nm using a colorimeter after the molded article is left at 85° C. and 85% RH for 300 hours, to initial reflectance ($R_0$) of the molded article, as measured at a wavelength of 450 nm using a colorimeter, ($R/R_0$) may be about 0.95 or more.

A difference ($\Delta Y$) between an initial yellow index of the molded article measured using a colorimeter and a yellow index of the molded article measured using a colorimeter after the molded article is left at 170° C. for 150 hours may be about 9 or less.

The molded article may include a reflector for light emitting diodes (LEDs).

The polyester resin composition includes a reflectance retention agent containing a basic inorganic compound, and thereby can exhibit excellent initial reflectance and excellent reflectance retention rate since the polyester resin composition can maintain initial reflectance at a high level over a long period of time under constant temperature and humidity conditions.

In addition, the polyester resin composition also can exhibit improved yellowing resistance, and thereby can realize improved light extraction capability even though the polyester resin composition is used as a reflector of a light emitting diode for a long period of time.

The present invention is not limited to the advantages as set forth above, and other advantages of the present invention will be clearly understood by those skilled in the art from the claims.

DETAILED DESCRIPTION

Hereinafter, embodiments of the present invention will be described in detail in the following detailed description, in which some, but not all, embodiments are described. Indeed, this invention may be embodied in many different forms and should not be construed as limited to the embodiments set forth herein; rather, these embodiments are provided so that this disclosure will satisfy applicable legal requirements. It should be understood that the following embodiments are provided for complete disclosure and thorough understanding of the invention by those skilled in the art. Descriptions of known functions and constructions which can unnecessarily obscure the subject matter of the invention will be omitted.

Unless otherwise defined herein, all terms including technical and scientific terms used herein have the same meanings as commonly understood by those skilled in the art to which the present invention pertains. It will be further understood that terms, such as those defined in commonly used dictionaries, should not be interpreted in an idealized or overly formal sense unless expressly so defined herein Hereinafter, a polyester resin composition according to embodiments of the present invention will be described in detail.

The polyester resin composition includes: (A) a polyester resin; (B) a white pigment; and (C) a reflectance retention agent.

Each of the components of the polyester resin composition will be described in detail.

(A) Polyester Resin

The (A) polyester resin may be an aromatic polyester resin, which can provide excellent heat resistance.

The polyester resin may be used to improve heat resistance and mechanical properties of the polyester resin composition at high temperature encountered during processes of manufacturing LED parts and the like. Heat resistance can be achieved by the resin having a high melting point. The polyester resin can have a melting point of about 200° C. or more, for example about 220° C. to about 380° C., and as another example about 260° C. to about 320° C. If the melting point of the polyester resin is greater than about 380° C., the polyester resin composition can exhibit deterioration in processability.

The polyester resin may have a structure in which a main chain includes an aromatic ring and an alicyclic ring. In exemplary embodiments, the polyester resin may be prepared by polycondensation of a dicarboxylic acid component and a diol component including an alicyclic diol. The polyester resin can include a cyclic structure and thus can have a high melting point.

The dicarboxylic acid component of the polyester resin includes one or more aromatic dicarboxylic acids and/or derivatives thereof. Examples of the aromatic dicarboxylic acids and/or derivatives thereof include without limitation terephthalic acid, isophthalic acid, phthalic acid, naphthalenedicarboxylic acid, and the like, and mixtures thereof. In exemplary embodiments, the aromatic dicarboxylic acid can include terephthalic acid.

The diol component of the polyester resin includes an alicyclic diol, for example 1,4-cyclohexanedimethanol (CHDM), in order to form a cyclic repeat unit.

In exemplary embodiments, the polyester resin may be poly(cyclo-1,4-hexanedimethylene terephthalate) (PCT) obtained by polycondensation of terephthalic acid and 1,4-cyclohexanedimethanol and having a structure in which a compound represented by Formula 1 is a fundamental repeat unit.

[Formula 1]

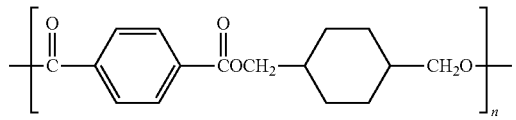

wherein n is an integer of 10 to 500.

The diol component of the polyester resin may further optionally include ethylene glycol, which is an aliphatic diol, in addition to 1,4-cyclohexanedimethanol.

When including ethylene glycol, the diol component of the polyester resin can include about 15% by weight (wt %) to about 100 wt %, for example about 30 wt % to about 80 wt % of 1,4-cyclohexanedimethanol, and optionally about 85 wt % or less, for example about 20 wt % to about 70 wt % of ethylene glycol.

In some embodiments, the diol component of the polyester resin can include 1,4-cyclohexanedimethanol in an amount of about 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 wt %. Further, according to some embodiments of the present invention, 1,4-cyclohexanedimethanol may be present in an amount of from about any of the foregoing amounts to about any other of the foregoing amounts.

In some embodiments, the polyester resin composition can include ethylene glycol in an amount of 0 (ethylene glycol is not present), about 0 (ethylene glycol is present), 1, 2, 3, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, or 85 wt %. Further, according to some embodiments of the present invention, ethylene glycol may be present in an amount of from about any of the foregoing amounts to about any other of the foregoing amounts.

When the diol component of the polyester resin includes ethylene glycol in an amount within the above range, the polyester resin obtained by copolymerization can exhibit improved impact resistance with minimal or no deterioration in heat resistance.

The polyester resin may be modified by further including at least one $C_6$ to $C_{21}$ aromatic diol and/or at least one $C_3$ to $C_8$ aliphatic diol and/or at least one $C_4$ to $C_8$ alicyclic diol (which is not the same as 1,4-cyclohexanedimethanol) as a part of the diol component.

Examples of the $C_6$ to $C_{21}$ aromatic diol and/or $C_3$ to $C_8$ aliphatic diol and/or $C_4$ to $C_8$ alicyclic diol may include without limitation propane-1,3-diol, butane-1,4-diol, pentane-1,5-diol, hexane-1,6-diol, 3-methylpentane-2,4-diol, 2-methylpentane-1,4-diol, 2,2,4-trimethylpentane-1,3-diol, 2-ethylhexane-1,3-diol, 2,2-diethylpropane-1,3-diol, 1,4-cyclobutanedimethanol, 2,2-bis-(3-hydroxyethoxyphenyl)-propane, 2,2-bis-(4-hydroxypropoxyphenyl)-propane, and the like, and mixtures thereof.

The polyester resin can have an intrinsic viscosity [η] of about 0.4 dl/g to about 1.5 dl/g, for example about 0.5 dl/g to about 1.1 dl/g, as measured at 25° C. in an o-chlorophenol solution. If the intrinsic viscosity [η] of the polyester resin is less than about 0.4 dl/g, the polyester resin composition can exhibit deterioration in mechanical properties, and if the intrinsic viscosity [η] of the polyester resin is greater than about 1.5 dl/g, the polyester resin composition can exhibit deterioration in moldability.

The polyester resin may be prepared by any polycondensation methods known in the art. These methods may include direct condensation of acid by transesterification using glycol or a lower alkyl ester.

The polyester resin composition can include the polyester resin in an amount of about 30 wt % to about 80 wt %, for example about 40 wt % to about 75 wt %, based on 100 wt % of the polyester resin composition. In some embodiments, the polyester resin composition can include the polyester resin in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments of the present invention, the polyester resin may be present in an amount of from about any of the foregoing amounts to about any other of the foregoing amounts.

If the amount of the polyester resin is less than about 30 wt %, a thermoplastic resin composition can exhibit deterioration in heat resistance and mechanical properties, and if the amount of the polyester resin is greater than about 80 wt %, the thermoplastic resin composition can exhibit deterioration in moldability and photostability.

(B) White Pigment

The (B) white pigment may be used to realize sufficient reflectance of the polyester resin composition.

Examples of the white pigment may include without limitation titanium oxide, zinc oxide, zinc sulfide, white lead, zinc sulfate, barium sulfate, calcium carbonate, aluminum oxide, and the like, and mixtures thereof.

The white pigment can have a particle diameter of about 0.05 μm to about 2.0 μm, for example about 0.05 μm to about 0.7 μm. Within this range, the polyester resin composition can exhibit improved reflectance.

Here, although the particle diameter may be represented as an average size of a group through quantification using a measurement method, a general representation of the particle diameter may include a mode diameter representing a maximum value of a distribution, a median diameter corresponding to a median value of an integral distribution curve, various average diameters (number average, length average, area average, mass average, volume average diameters, and the like), and the like. Unless otherwise stated, the particle diameter as used herein refers to D50 (a diameter at a distribution rate of 50%) which is a number average particle diameter.

The white pigment may include a silane coupling agent and/or a titanium coupling agent on a surface thereof for stable bonding to the polyester resin. Examples of the silane coupling agent may include without limitation vinyltriethoxysilane, 2-aminopropyltriethoxysilane, 2-glycidoxypropyltriethoxysilane and the like, and mixtures thereof.

In some embodiments, the white pigment may be a white pigment subjected to surface modification with an inorganic and/or organic surface treatment agent, and surface modification may be performed a plurality of times.

Examples of the inorganic surface treatment agent may include without limitation aluminum oxide, silicon dioxide (silica), zirconium dioxide (zirconia), sodium silicate, sodium aluminate, sodium aluminum silicate, zinc oxide, mica and the like, and mixtures thereof. Examples of the organic surface treatment agent may include without limitation polydimethylsiloxane, trimethylpropane, pentaerythritol and the like, and mixtures thereof. In exemplary embodiments, the surface treatment agent can include aluminum oxide.

The inorganic and/or organic surface treatment agent may be present in an amount of about 0.1 parts by weight to about 1 part by weight based on about 100 parts by weight of the white pigment.

The polyester resin composition can include the white pigment in an amount of about 10 wt % to about 60 wt %, for example about 15 wt % to about 50 wt %, based on 100 wt % of the polyester resin composition. In some embodiments, the polyester resin composition can include the white pigment in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the white pigment may be present in an amount of from about any of the foregoing amounts to about any other of the foregoing amounts.

If the amount of the white pigment is less than about 10 wt %, the polyester resin composition can suffer from deterioration in optical properties due to deterioration in reflectance thereof, and if the amount of the white pigment is greater than about 60 wt %, the polyester resin composition can suffer from deterioration in mechanical properties such as impact resistance.

(C) Reflectance Retention Agent

The (C) reflectance retention agent is added in conjunction with the (B) white pigment, whereby the polyester resin composition can maintain high initial reflectance at an excellent level over a long period of time.

The reflectance retention agent includes a basic inorganic compound, for example an inorganic compound having a pH of about 7.5 to about 14, and as another example an inorganic compound having a pH of about 9 to about 11.

The reflectance retention agent including the basic inorganic compound can effectively prevent the polyester resin including a terminal acid group from being decomposed by moisture, whereby the polyester resin composition can maintain high reflectance even after extended use.

The basic inorganic compound may include a metal. The metal may include alkali metals and/or alkaline earth metals. In exemplary embodiments, the basic inorganic compound includes calcium (Ca) and/or magnesium (Mg).

For example, the reflectance retention agent may be calcium silicate or magnesium silicate, and may include a mixture thereof, as needed.

The (C) reflectance retention agent may have an acicular shape and may have a ratio of length to particle diameter of about 5:1 to about 20:1. Herein, the length is a longitudinal length of the reflectance retention agent and the particle diameter is a cross-sectional diameter thereof.

The polyester resin composition can include the reflectance retention agent in an amount of about 1 wt % to about 40 wt %, for example about 5 wt % to about 30 wt %, based on 100 wt % of the polyester resin composition. In some embodiments, the polyester resin composition can include the reflectance retention agent in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the reflectance retention agent may be present in an amount of from about any of the foregoing amounts to about any other of the foregoing amounts.

If the amount of the reflectance retention agent is less than about 1 wt %, initial reflectance of the polyester resin composition can be significantly deteriorated over time, and if the amount of the reflectance retention agent is greater than about 40 wt %, the polyester resin composition can exhibit insignificant improvement in reflectance retention rate and can suffer from deterioration in mechanical properties and heat resistance.

(D) Other Additives

The polyester resin composition may further include one or more other additives, such as but not limited to UV stabilizers, fluorescent whitening agents, lubricants, release agents, nucleating agents, antistatic agents, stabilizers, reinforcing agents, inorganic additives, colorants including pigments and dyes, and the like, and mixtures thereof, in addition to the components set forth above, depending upon the purpose of each of the additives.

The UV stabilizer serves to suppress the polyester resin composition from suffering from color change and deterioration in light reflectivity due to UV irradiation. Examples of the UV stabilizers may include without limitation benzotriazole compounds, benzophenone compounds, triazine compounds and the like, and mixtures thereof.

The fluorescent whitening agent serves to improve light reflectance of the polyester resin composition. Examples of the fluorescent whitening agent may include without limitation stilbene-bis(benzoxazole) derivatives such as 4-(benzoxazol-2-yl)-4'-(5-methylbenzoxazol-2-yl)stilbene, 4,4'-bis(benzoxazol-2-yl)stilbene and the like, and mixtures thereof.

The lubricant is a material for assisting in flow or movement of the polyester resin composition by lubricating a metal surface contacting the resin composition during processing, molding or extrusion of the resin composition, and may include a typical material.

Examples of the release agent may include without limitation fluorine-containing polymers, silicone oils, metal salts of stearic acid, metal salts of montanic acid, montanic acid ester waxes, polyethylene waxes and the like, and mixtures thereof.

The nucleating agent may be clay.

The additive may be present in an amount of about 0.1 parts by weight to about 15 parts by weight based on about 100 parts by weight of the polyester resin composition.

The polyester resin composition may be prepared by any method known in the art. For example, the polyester resin composition may be prepared in pellet form by simultaneously mixing the components of the present invention with other optional additives, followed by melt extrusion of the mixture in an extruder.

According to exemplary embodiments, a molded article may be manufactured from the polyester resin composition as set forth above. The polyester resin composition can exhibit excellent reflectance, reflectance retention rate and yellowing resistance while maintaining excellent mechanical properties.

The molded article may have an initial reflectance of about 92 or more, as measured at a wavelength of 450 nm using a colorimeter, and a reflectance of about 89 or more, for example about 89.5 or more, as measured at a wavelength of 450 nm using a colorimeter after the molded article is left at 85° C. and 85% relative humidity (RH) for 300 hours.

In addition, a ratio of reflectance ($R_1$) of the molded article, as measured at a wavelength of 450 nm using a colorimeter after the molded article is left at 85° C. and 85% RH for 100 hours, to initial reflectance ($R_0$) of the molded article, as measured at a wavelength of 450 nm using a colorimeter, ($R_1/R_0$) may be about 0.97 or more, for example about 0.98 or more.

Further, a ratio of reflectance ($R_2$) of the molded article, as measured at a wavelength of 450 nm using a colorimeter after the molded article is left at 85° C. and 85% RH for 300 hours, to initial reflectance ($R_0$) of the molded article, as measured at a wavelength of 450 nm using a colorimeter, ($R_2/R_0$) may be about 0.95 or more, for example about 0.96 or more.

A difference between an initial yellow index of the molded article measured using a colorimeter and a yellow index of the molded article measured using a colorimeter after the molded article is left at 170° C. for 150 hours ($\Delta Y$) may be about 9 or less, for example about 8.8 or less.

The polyester resin composition according to the present invention can exhibit excellent reflectance, reflectance retention rate and yellowing resistance, and thus can be used for any molded articles requiring these properties without limitation. For example, the polyester resin composition may be useful as a reflector for light emitting diodes (LEDs).

EXAMPLES

Next, some examples for proving excellent effects of the polyester resin composition according to the present invention will be described in detail.

Details of components used for polyester resin compositions of Examples and Comparative Examples are as follows.

(a) Polyester Resin

Puratan0502 (SK Chemical Co., Ltd.) corresponding to poly(cyclo-1,4-hexanedimethylene terephthalate) (PCT) is used.

(b) White Pigment

CR-470 (Tronox Co., Ltd.) corresponding to titanium oxide is used.

(c) Reflectance Retention Agent (c-1) A metal inorganic compound (calcium silicate) having a pH of 9.7 is used.

(c-2) A metal inorganic compound (calcium silicate) having a pH of 10.3 is used.

(c-3) A nonmetal inorganic compound (glass fiber) having a pH of 4.3 is used.

(c-4) A nonmetal inorganic compound (glass fiber) having a pH of 5.3 is used.

Components as listed in Table 1 are introduced into a mixer, followed by dry mixing. Next, the mixture is processed at a nozzle temperature of 250° C. to 350° C. using a 45 mm Φ twin screw extruder, thereby preparing a thermoplastic resin composition in pellet form through the extruder. The prepared pellets are dried at 100° C. for 4 hours or more, followed by injection molding of a specimen for property evaluation.

The content of each of the components as listed in Table 1 is given in wt %.

TABLE 1

|   |   | Example 1 | Example 2 | Comparative Example 1 | Comparative Example 2 |
|---|---|---|---|---|---|
| (a) | | 60 | 60 | 60 | 60 |
| (b) | | 20 | 20 | 20 | 20 |
| (c) | (c-1) | 20 | — | — | — |
|   | (c-2) | — | 20 | — | — |
|   | (c-3) | — | — | 20 | — |
|   | (c-4) | — | — | — | 20 |

Each of the polyester resin compositions of Examples 1 to 2 and Comparative Examples 1 to 2 is evaluated as to flexural modulus, reflectance, and yellowing resistance. An evaluation method for each of the evaluation items is as follows. Results of each of the evaluation items are shown in Table 2.

<Flexural Modulus>

Flexural modulus is measured under the condition of 2.8 mm/min in accordance with ASTM D790.

<Reflectance>

Initial reflectance (specular component included, SCI) is measured at a wavelength of 450 nm using a colorimeter (3600D CIE Lab., Minolta Co., Ltd.), followed by again measuring reflectance of the specimen after the specimen is left at 85° C. and 85% RH for each of 100 hours and 300 hours, thereby evaluating reflectance retention rate.

<Yellowing Resistance>

Initial yellow index is measured using a colorimeter (3600D CIE Lab., Minolta Co., Ltd.), followed by again measuring yellow index of the specimen after the specimen is left at 170° C. for 150 hours, thereby evaluating change in yellow index.

TABLE 2

|   |   | Example 1 | Example 2 | Comparative Example 1 | Comparative Example 2 |
|---|---|---|---|---|---|
| Flexural modulus (kgf/cm$^2$) | | 53,600 | 74,700 | 71,400 | 66,100 |
| Reflectance (100 hours) | $R_0$ | 94.5 | 93.8 | 94.4 | 94.5 |
|   | $R_1$ | 92.9 | 91.9 | 90.2 | 90.7 |
|   | $R_1/R_0$ | 0.97 | 0.98 | 0.96 | 0.96 |
| Reflectance (300 hours) | $R_0$ | 94.5 | 93.8 | 94.4 | 94.5 |
|   | $R_2$ | 90.4 | 89.6 | 87.8 | 88.8 |
|   | $R_2/R_0$ | 0.96 | 0.96 | 0.93 | 0.94 |
| Yellow index (150 hours) | $Y_0$ | 2.85 | 3.24 | 2.90 | 2.95 |
|   | $Y_1$ | 10.78 | 11.98 | 11.95 | 12.10 |
|   | $\Delta Y$ | 7.93 | 8.74 | 9.05 | 9.15 |

From Tables 1 and 2, it can be seen that the polyester resin compositions of Examples 1 to 2 exhibit excellent flexural modulus, reflectance and yellow index.

It can also be seen that, since the polyester resin compositions of Comparative Examples 1 to 2 prepared using an acidic inorganic compound exhibit significant deterioration in reflectance after 100 hours and reflectance after 300 hours as compared with those of Examples 1 and 2, the polyester resin compositions of Comparative Examples 1 to 2 exhibit deterioration in reflectance retention rate. In addition, the polyester resin compositions of Comparative Examples 1 to 2 are likely to be discolored over time due to a lower yellow index difference ($\Delta Y$) than the polyester resin compositions of Examples.

Therefore, it can be seen that pH of the inorganic compound added to the polyester resin composition is an important factor in improvement of flexural modulus, reflectance and yellow index of the polyester resin composition.

Although some embodiments have been described above, it should be understood that these embodiments are provided for illustration only and are not to be construed in any way as limiting the present invention, and that various modifications, changes, alterations, and equivalent embodiments can be made by those skilled in the art without departing from the spirit and scope of the invention. Therefore, the scope of the present invention should be defined by the appended claims and equivalents thereof.

What is claimed is:

1. A polyester resin composition comprising:
(A) about 30 wt % to about 80 wt % of a polyester resin selected from the group consisting of a poly(cyclo-1,4-hexanedimethylene terephthalate);
(B) about 10 wt % to about 60 wt % of titanium oxide; and
(C) about 10 wt % to about 40 wt % of a reflectance retention agent comprising calcium silicate having a pH of 10.3 to about 11, each based on 100 wt % of the polyester resin composition,
wherein a molded article manufactured from the polyester resin composition has an initial reflectance $R_0$ of 92 or more, as measured at a wavelength of 450 nm using a colorimeter,
wherein the molded article manufactured from the polyester resin composition has a ratio of reflectance ($R_1$) of the molded article, as measured at a wavelength of 450 nm using a colorimeter after the molded article is left at 85° C. and 85% relative humidity (RH) for 100 hours, to initial reflectance ($R_0$) of the molded article, as measured at a wavelength of 450 nm using a colorimeter, ($R_1/R_0$) of 0.98 or more;
wherein a molded article manufactured from the polyester resin composition has a ratio of reflectance ($R_2$) of the molded article, as measured at a wavelength of 450 nm using a colorimeter after the molded article is left at 85° C. and 85% relative humidity (RH) for 300 hours, to initial reflectance ($R_0$) of the molded article, as measured at a wavelength of 450 nm using a colorimeter, ($R_2/R_0$) of 0.95 or more, and
wherein a molded article manufactured from the polyester resin composition has a difference between an initial yellow index of the molded article measured using a colorimeter and a yellow index of the molded article measured using a colorimeter after the molded article is left at 170° C. for 150 hours ($\Delta Y$) of 9 or less.

2. The polyester resin composition according to claim 1, comprising:
about 40 wt % to about 75 wt % of the polyester resin (A);
about 15 wt % to about 50 wt % of the white pigment (B); and
about 10 wt % to about 30 wt % of the reflectance retention agent (C).

3. The polyester resin composition according to claim 2, comprising:
about 50 wt % to about 70 wt % of the polyester resin (A);
about 15 wt % to about 25 wt % of the white pigment (B); and
about 10 wt % to about 30 wt % of the reflectance retention agent (C).

4. A polyester resin composition comprising:
(A) about 30 wt % to about 80 wt % of a polyester resin selected from the group consisting of a polyester resin including a repeat unit represented by Formula 1 and having a melting point of about 200° C. or more:

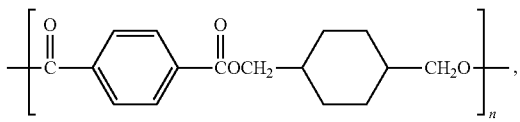

[Formula 1]

wherein n is an integer of 10 to 500;
(B) about 10 wt % to about 60 wt % of a white pigment;
(C) about 10 wt % to about 40 wt % of a reflectance retention agent comprising an inorganic compound calcium silicate having a pH of 10.3 to about 11, each based on 100 wt % of the polyester resin composition, and
optionally a UV stabilizer, fluorescent whitening agent, lubricant, release agent, nucleating agent, antistatic agent, stabilizer, reinforcing agent, inorganic additive, pigment, dye, or a combination thereof,
wherein a molded article manufactured from the polyester resin composition has an initial reflectance $R_0$ of 92 or more, as measured at a wavelength of 450 nm using a colorimeter,
wherein the molded article manufactured from the polyester resin composition has a ratio of reflectance ($R_1$) of the molded article, as measured at a wavelength of 450 nm using a colorimeter after the molded article is left at 85° C. and 85% relative humidity (RH) for 100 hours, to initial reflectance ($R_0$) of the molded article, as measured at a wavelength of 450 nm using a colorimeter, ($R_1/R_0$) of 0.98 or more;
wherein the molded article manufactured from the polyester resin composition has a ratio of reflectance ($R_2$) of the molded article, as measured at a wavelength of 450 nm using a colorimeter after the molded article is left at 85° C. and 85% relative humidity (RH) for 300 hours, to initial reflectance ($R_0$) of the molded article, as measured at a wavelength of 450 nm using a colorimeter, ($R_2/R_0$) of 0.95 or more, and
wherein the molded article has a difference between an initial yellow index of the molded article measured using a colorimeter and a yellow index of the molded article measured using a colorimeter after the molded article is left at 170° C. for 150 hours ($\Delta Y$) of 9 or less.

5. The polyester resin composition according to claim 4, comprising:
about 40 wt % to about 75 wt % of the polyester resin (A);
about 15 wt % to about 50 wt % of the white pigment (B); and
about 10 wt % to about 30 wt % of the reflectance retention agent (C).

6. The polyester resin composition according to claim 5, comprising:
about 50 wt % to about 70 wt % of the polyester resin (A);
about 15 wt % to about 25 wt % of the white pigment (B); and
about 10 wt % to about 30 wt % of the reflectance retention agent (C).

7. The polyester resin composition according to claim 4, wherein the (B) white pigment comprises titanium oxide, zinc oxide, zinc sulfide, white lead, zinc sulfate, barium sulfate, calcium carbonate, aluminum oxide, or a combination thereof.

8. The polyester resin composition according to claim 4, wherein the (B) white pigment has a particle size of about 0.05 μm to about 2.0 μm.

9. The polyester resin composition according to claim 4, wherein the (C) reflectance retention agent has an acicular shape having a ratio of length to particle diameter of about 5:1 to about 20:1.

10. The polyester resin composition according to claim 4, comprising (C) about 15 wt % to about 40 wt % of the reflectance retention agent comprising an inorganic compound calcium silicate having a pH of 10.3 to about 11.

11. The polyester resin composition according to claim 4, wherein a molded article manufactured from the polyester resin composition has a ratio of reflectance ($R_2$) of the molded article, as measured at a wavelength of 450 nm using a colorimeter after the molded article is left at 85° C. and 85% relative humidity (RH) for 300 hours, to initial reflectance ($R_0$) of the molded article, as measured at a wavelength of 450 nm using a colorimeter, ($R_2/R_0$) of 0.96 or more.

12. The polyester resin composition according to claim 4, wherein the molded article has a difference between an initial yellow index of the molded article measured using a colorimeter and a yellow index of the molded article measured using a colorimeter after the molded article is left at 170° C. for 150 hours ($\Delta Y$) of 8.8 or less.

13. A molded article manufactured from the polyester resin composition according to claim 4.

14. The molded article according to claim 13, wherein the molded article has a reflectance of 89 or more, as measured at a wavelength of 450 nm using a colorimeter after the molded article is left at 85° C. and 85% relative humidity (RH) for 300 hours.

15. The molded article according to claim 13, wherein the molded article is a reflector for light emitting diodes (LEDs).

* * * * *